(12) United States Patent
Ahn et al.

(10) Patent No.: US 9,893,142 B2
(45) Date of Patent: Feb. 13, 2018

(54) METHOD FOR MANUFACTURING SEMICONDUCTOR DEVICE

(71) Applicant: Samsung Electronics Co., Ltd., Suwon-si, Gyeonggi-do (KR)

(72) Inventors: Se-Hyoung Ahn, Seoul (KR); Young-Geun Park, Suwon-si (KR); Jong-Bom Seo, Seoul (KR); Jae-Hyoung Choi, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 18 days.

(21) Appl. No.: 15/083,688

(22) Filed: Mar. 29, 2016

(65) Prior Publication Data
US 2017/0018604 A1 Jan. 19, 2017

(30) Foreign Application Priority Data
Jul. 15, 2015 (KR) .................. 10-2015-0100205

(51) Int. Cl.
*H01L 21/20* (2006.01)
*H01L 49/02* (2006.01)
(Continued)

(52) U.S. Cl.
CPC .......... *H01L 28/40* (2013.01); *H01L 21/0228* (2013.01); *H01L 21/02148* (2013.01); *H01L 21/02159* (2013.01); *H01L 21/02161* (2013.01); *H01L 21/02175* (2013.01); *H01L 21/02178* (2013.01); *H01L 21/02181* (2013.01); *H01L 21/02183* (2013.01); *H01L 21/02186* (2013.01); *H01L 21/02189* (2013.01); *H01L 21/02194* (2013.01); *H01L 21/02271* (2013.01); *H01L 27/10852* (2013.01)

(58) Field of Classification Search
CPC .......... H01L 21/28194; H01L 21/0228; H01L 21/3141; H01L 21/3142; H01L 21/31604
See application file for complete search history.

(56) References Cited

U.S. PATENT DOCUMENTS 6,649,502 B2   11/2003   Yoo et al.
6,863,726 B2   3/2005    Hase
(Continued)

FOREIGN PATENT DOCUMENTS

KR   20060002137 A   1/2006
KR   20030114249 A   12/2008
KR   20090128911 A   12/2009

*Primary Examiner* — Zandra Smith
*Assistant Examiner* — John M Parker
(74) *Attorney, Agent, or Firm* — Harness, Dickey & Pierce, P.L.C.

(57) ABSTRACT

A method of manufacturing a semiconductor device includes forming a lower metal layer, forming an interfacial oxide film on the lower metal layer, providing a metal precursor on the interfacial oxide film at a first pressure to adsorb the metal precursor into the interfacial oxide film, performing a first purge process at a second pressure to remove the unadsorbed metal precursor, the second pressure lower than the first pressure, providing an oxidizing gas at the first pressure to react with the adsorbed metal precursor, performing a second purge process at the second pressure to remove the unreacted oxidizing gas and form a dielectric film, and forming an upper metal layer on the dielectric film.

18 Claims, 17 Drawing Sheets

(51) Int. Cl.
  *H01L 27/108* (2006.01)
  *H01L 21/02* (2006.01)

(56) References Cited

U.S. PATENT DOCUMENTS

| | | |
|---|---|---|
| 6,933,245 B2 | 8/2005 | Lee et al. |
| 7,446,053 B2 | 11/2008 | Kil et al. |
| 7,576,016 B2 | 8/2009 | Koyanagi et al. |
| 7,772,132 B2 | 8/2010 | Kil et al. |
| 2006/0228868 A1* | 10/2006 | Ahn ............... C23C 16/405 438/453 |
| 2007/0001201 A1* | 1/2007 | Kil ................. H01G 4/12 257/295 |
| 2008/0032424 A1* | 2/2008 | Ahn ............... C23C 16/409 438/3 |
| 2010/0055829 A1* | 3/2010 | Im ................. C23C 16/45531 438/102 |
| 2012/0064690 A1* | 3/2012 | Hirota ............ H01L 21/02189 438/381 |
| 2012/0149193 A1 | 6/2012 | Fujiwara |
| 2013/0171797 A1 | 7/2013 | Park et al. |
| 2014/0327062 A1 | 11/2014 | Park et al. |

* cited by examiner

1300

1400

METHOD FOR MANUFACTURING SEMICONDUCTOR DEVICE

CROSS REFERENCE TO RELATED APPLICATION

This application claims priority from Korean Patent Application No. 10-2015-0100205 filed on Jul. 15, 2015 in the Korean Intellectual Property Office, and all the benefits accruing therefrom under 35 U.S.C. 119, the contents of which in its entirety are herein incorporated by reference.

BACKGROUND

1. Field

Example embodiments of the present inventive concepts relate to a method of manufacturing a semiconductor device.

2. Description of the Related Art

In recent years, as semiconductor devices have attained larger capacity and higher integration, their design rules also persistently decrease. Such a tendency also occurs in a dynamic random access memory (DRAM) as one such memory semiconductor device. A capacitance of a certain level or more is required for each cell to operate the DRAM device. An increase in capacitance increases an amount of charge stored in a capacitor, and improves refresh characteristics of the semiconductor device. The improved refresh characteristics of the semiconductor device may improve the yield of the semiconductor device.

Reliability of the capacitor may be influenced by interface characteristics between two electrodes forming the capacitor and a dielectric disposed between them. That is, electrical characteristics such as a leakage current of the capacitor are determined depending on the characteristics of the dielectric.

SUMMARY

Example embodiments of the present inventive concepts provide a method of manufacturing a semiconductor device capable of improving the electrostatic capacity and the reliability of the capacitor, by preventing or inhibiting a loss of oxygen atoms in a dielectric film by utilizing the interface processing technique between the dielectric film and the electrode.

Example embodiments of the present inventive concepts provide a method of manufacturing a semiconductor device including a capacitor capable of providing a uniformly oxidized interfacial oxide film and a dielectric film deposited to have a uniform thickness.

However, the present inventive concepts are not restricted to those set forth herein. The present inventive concepts which are not mentioned herein will become more apparent to a person skilled in the art to which the present inventive concepts pertain by referencing the detailed description of the present inventive concepts given below.

According to example embodiments of the present inventive concepts, a method of manufacturing a semiconductor device includes forming a lower metal layer, forming an interfacial oxide film on the lower metal layer, providing a metal precursor on the interfacial oxide film at a first pressure to adsorb the metal precursor into the interfacial oxide film, performing a first purge process at a second pressure to remove the unadsorbed metal precursor, the second pressure lower than the first pressure, providing an oxidizing gas at the first pressure to react with the adsorbed metal precursor, performing a second purge process at the second pressure to remove the unreacted oxidizing gas and form a dielectric film, and forming a upper metal layer on the dielectric film.

In example embodiments of the present inventive concepts, the method may further include performing a first vacuum process performed at a third pressure lower than the second pressure prior to providing the oxidizing gas and after performing the first purge process.

In example embodiments of the present inventive concepts, providing the metal precursor, performing the first purge process and performing the first vacuum process may be performed sequentially and repeatedly.

In example embodiments of the present inventive concepts, the method may further include performing a second vacuum process at the third pressure after performing the second purge process.

In example embodiments of the present inventive concepts, providing the oxidizing gas, performing the second purge process and performing the second vacuum process may be performed sequentially and repeatedly.

In example embodiments of the present inventive concepts, the second pressure may be 10 Pa or less.

In example embodiments of the present inventive concepts, the lower metal layer may have a cylindrical shape.

In example embodiments of the present inventive concepts, the interfacial oxide film may be formed at a fourth pressure lower than the first pressure and higher than the second pressure.

In example embodiments of the present inventive concepts, the first pressure may be at least 10 times more than the second pressure.

According to example embodiments of the present inventive concepts, a method of manufacturing a semiconductor device includes forming a lower electrode having a cylindrical shape, the lower electrode including a titanium nitride film, forming an interfacial film on the lower electrode, the interfacial film including a titanium oxide film, providing a zirconium precursor on the interfacial film to adsorb the zirconium precursor into the interfacial film, performing a first purge process to remove the unadsorbed zirconium precursor at a pressure of 10 Pa or less, providing an oxidizing gas to react with the adsorbed zirconium precursor and form a dielectric film, and forming an upper electrode on the dielectric film.

In example embodiments of the present inventive concepts, the method may further include performing a first vacuum process at a pressure of 5 Pa or less prior to providing the oxidizing gas and after performing the first purge process.

In example embodiments of the present inventive concepts, providing the zirconium precursor, performing the first purge process and performing the first vacuum process may be performed sequentially and repeatedly.

In example embodiments of the present inventive concepts, the method may further include performing a second purge process to remove the unreacted oxidizing gas at the pressure of 10 Pa or less after providing the oxidizing gas.

In example embodiments of the present inventive concepts, the method may further include performing a second vacuum process at the pressure of 5 Pa or less after performing the second purge process.

In example embodiments of the present inventive concepts, providing the oxidizing gas, performing the second purge process and performing the second vacuum process may be performed sequentially and repeatedly.

According to example embodiments of the present inventive concepts, a method includes forming an interfacial oxide film on a cylindrical lower electrode, providing a metal precursor on the interfacial oxide film to adsorb the metal precursor into the interfacial oxide film, performing a first purge process to remove the unadsorbed metal precursor at a first pressure of 10 Pa or less, performing a first vacuum process at a second pressure less than the first pressure, providing an oxidizing gas to react with the adsorbed metal precursor and form a dielectric film, performing a second purge process to remove the unreacted oxidizing gas at the first pressure, and performing a second vacuum process at the second pressure.

In example embodiments of the present inventive concepts, the second pressure may be 5 Pa or less.

In example embodiments of the present inventive concepts, providing the metal precursor, performing the first purge process and performing the first vacuum process may be performed sequentially and repeatedly.

In example embodiments of the present inventive concepts, providing the oxidizing gas, performing the second purge process and performing the second vacuum process may be performed sequentially and repeatedly.

In example embodiments of the present inventive concepts, the method may further include forming an upper electrode on the dielectric film.

DETAILED DESCRIPTION

Figure 1:
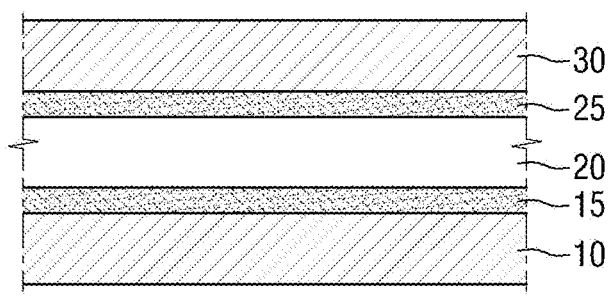
FIG. 1 is a cross-sectional view for explaining a semiconductor device according to example embodiments of the present inventive concepts.

Advantages and features of the present inventive concepts and methods of accomplishing the same may be understood more readily by reference to the following detailed description of example embodiments and the accompanying drawings. The present inventive concepts may, however, be embodied in many different forms and should not be construed as being limited to the embodiments set forth herein. Rather, these embodiments are provided so that this disclosure will be thorough and complete and will fully convey the concepts of the disclosure to those skilled in the art, and the present inventive concepts will only be defined by the appended claims. In the drawings, the thickness of layers and regions are exaggerated for clarity.

It will be understood that when an element or layer is referred to as being "connected to," or "coupled to" another element or layer, it can be directly connected to or coupled to another element or layer or intervening elements or layers may be present. In contrast, when an element is referred to as being "directly connected to" or "directly coupled to" another element or layer, there are no intervening elements or layers present. Like numbers refer to like elements throughout. As used herein, the term "and/or" includes any and all combinations of one or more of the associated listed items.

It will also be understood that when a layer is referred to as being "on" another layer or substrate, it can be directly on the other layer or substrate, or intervening layers may also be present. In contrast, when an element is referred to as being "directly on" another element, there are no intervening elements present.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present inventive concepts.

The use of the terms "a" and "an" and "the" and similar referents in the context of describing the inventive concepts (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which the inventive concepts belong. It is noted that the use of any and all examples, or example terms provided herein is intended merely to better illuminate the inventive concepts and is not a limitation on the scope of the inventive concepts unless otherwise specified. Further, unless defined otherwise, all terms defined in generally used dictionaries may not be overly interpreted.

Hereinafter, a semiconductor device according to example embodiments of the present inventive concepts will be described with reference to FIGS. 1 to 2b.

Figure 2A:
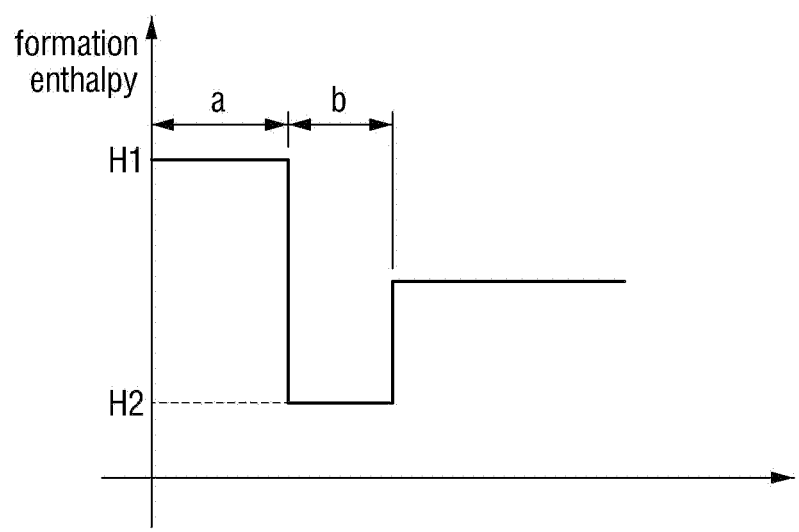
FIG. 2a is a diagram illustrating a formation enthalpy between an upper metal layer and a second interfacial oxide film of FIG. 1.
Figure 2B:
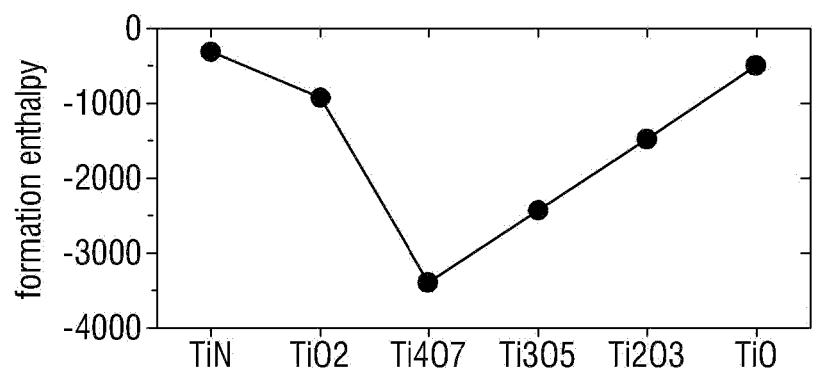
FIG. 2b is a graph illustrating a formation enthalpy between TiN and $TiO_x$ which can be used as each of the upper metal layer and the second interfacial oxide film of FIG. 1.

FIG. 1 is a cross-sectional view for explaining a semiconductor device according to example embodiments of the present inventive concepts. FIG. 2a is a diagram illustrating a formation enthalpy between an upper metal layer and a second interfacial oxide film of FIG. 1. FIG. 2b is a graph illustrating a formation enthalpy between TiN and $TiO_x$ which can be used as each of the upper metal layer and the second interfacial oxide film of FIG. 1.

Referring to FIG. 1, the semiconductor device 1 includes a lower metal layer 10, a first interfacial oxide film 15, a dielectric film 20, a second interfacial oxide film 25 and an upper metal layer 30.

The lower metal layer 10 may include at least one selected from doped polysilicon, a conductive metal nitride (e.g., titanium nitride, tantalum nitride or tungsten nitride), metal (e.g., ruthenium, iridium, titanium or tantalum), a conductive metal oxide (e.g., iridium oxide) and the like. The lower metal layer 10 may be a substrate doped with impurities. For example, the substrate may be a P-type substrate or an N-type substrate.

In example embodiments, the lower metal layer 10 may be a lower electrode of the capacitor. However, the lower metal layer 10 is not limited thereto.

The first interfacial oxide film 15 may be formed on the lower metal layer 10. The first interfacial oxide film 15 is formed to be in contact with the lower metal layer 10. For example, the first interfacial oxide film 15 is formed in direct contact with the lower metal layer 10.

The first interfacial oxide film 15, for example, may be a compound containing oxygen, for example, a metal oxide. The first interfacial oxide film 15, for example, may contain any one of hafnium oxide ($HfO_x$), titanium oxide ($TiO_x$), molybdenum oxide ($MoO_x$), niobium oxide ($NbO_x$), tantalum oxide ($TaO_x$), and ruthenium oxide ($RuO_x$).

The metal contained in the metal oxide forming the first interfacial oxide film 15 may be a transition metal, and may have a plurality of oxidation numbers. Therefore, the metal of the metal oxide forming the first interfacial oxide film 15 may be bonded to oxygen to form a compound having a plurality of chemical formulas. For example, when the first interfacial oxide film 15 is a titanium oxide, titanium as a metal element of the titanium oxide may have a plurality of oxidation numbers, and may form a variety of oxides, e.g., $TiO$, $Ti_2O_3$, $Ti_3O_5$, $Ti_4O_7$, $TiO_2$, etc.

The first interfacial oxide film 15 may have a thickness that is not suitable for a dielectric film, for example, a thickness between 1 Å to 10 Å. Further, the thickness of the first interfacial oxide film 15 may be thinner than the thickness of the dielectric film 20 disposed on the first surface oxide film 15.

The first interfacial oxide film 15, for example, may be formed using an atomic layer deposition (ALD) method or a chemical vapor deposition (CVD) method. However, the first interfacial oxide film 15 is not limited thereto. The detailed description of the manufacturing method will be provided later.

In the semiconductor device according to the example embodiments of the present inventive concepts, the first interfacial oxide film 15 may be a conductive film through which electricity flows. That is, the first interfacial oxide film 15 may serve as an electrode which provides electricity to the dielectric film 20. The first interfacial oxide film 15 may include an oxygen vacancy. Because the oxygen vacancy in the first interfacial oxide film 15 may form a current path that allows the current to flow, the first interfacial oxide film 15 may be a conductive film through which electricity flows.

The first interfacial oxide film 15 may prevent or inhibit the oxygen atoms contained in the dielectric film 20 from being diffused to the lower metal layer 10, and may be an oxygen-donating film which supplies oxygen to the lower metal layer 10 during the manufacturing process. Further, the first interfacial oxide film 15 may prevent or inhibit the nitrogen atoms contained in the lower metal layer 10 from permeating into the dielectric film 20.

The dielectric film 20 may be formed on the first interfacial oxide film 15. The dielectric film 20, for example, may be a metal oxide dielectric film and may include a high dielectric constant dielectric film. The high constant dielectric film, for example, may be a multilayered structure which includes one or a plurality of zirconium oxide ($ZrO_2$), hafnium oxide (HfO2), zirconium silicon oxide ($ZrSiO_x$), hafnium silicon oxide ($HfSiO_x$), zirconium, hafnium silicon oxide ($ZrHfSiO_x$), aluminum oxide ($Al_2O_3$), strontium titanium oxide ($SrTiO_3$), and barium strontium titanium oxide ($BaSrTiO_3$), but are not limited thereto.

The second interfacial oxide film 25 may be formed on the dielectric film 20. The second interfacial oxide film 25 may be substantially similar to the first interfacial oxide film 15.

Therefore, the second interfacial oxide film 25 may be a compound containing oxygen, for example, a metal oxide. Further, a metal contained in the metal oxide forming the second interfacial oxide film 25 may be a transition metal and may have a plurality of oxidation numbers. Further, the second interfacial oxide film 25 may be a conductive film through which electricity flows.

The second interfacial oxide film 25 may prevent or inhibit the oxygen atom contained in the dielectric film 20 from being diffused to the upper metal layer 30 and may also be an oxygen-donating film which supplies oxygen to the upper metal layer 30 during the manufacturing process. Further, the second interfacial oxide film 25 may prevent or inhibit the nitrogen atom contained in the upper metal layer 30 to be described later from permeating into the dielectric film 20.

The upper metal layer 30 is formed on the second interfacial oxide film 25. For example, the upper metal layer 30 is formed in direct contact with the second interfacial oxide film 25. The upper metal layer 30 may include a conductive metal nitride, for example, at least one of titanium nitride (TiN), zirconium nitride (ZrN), aluminum nitride (AlN), hafnium nitride (HfN), tantalum nitride (TaN), niobium nitride (NbN), yttrium nitride (YN), lanthanum nitride (LaN), vanadium nitride (VN), tungsten nitride (WN) and manganese nitride ($Mn_4N$). The upper metal layer 30 may be an upper electrode of the capacitor.

FIG. 2a is a diagram illustrating the formation enthalpy formed between the upper metal layer and the second interfacial oxide film of FIG. 1. FIG. 2b is a graph illustrating the formation enthalpy between TiN and $TiO_x$ which may be used as each of the upper metal layer and the second interfacial oxide film of FIG. 1.

The second interfacial oxide film 25 may prevent or inhibit diffusion of the oxygen atoms contained in the dielectric film 20 into the upper metal layer 30 and will be described from the viewpoint of the formation enthalpy.

The relationship between the second interfacial oxide film 25 and the upper metal layer 30 will be described. The expression "the formation enthalpy has a negative value" means that the energy state of a reaction starter is higher than the energy state of a reaction result, and the expression "the formation enthalpy has a positive value" means that the energy state of the reaction starter is lower than the energy state of the reaction result. From a thermodynamic point of view, although the formation enthalpy may depend on the peripheral reaction conditions, generally, there is a tendency that the material tends to vary in a direction of the lower energy state.

Referring to FIGS. 1 and 2a, a symbol "a" indicates the upper metal layer 30, and a symbol "b" indicates the second interfacial oxide film 25. In addition, the right portion of the symbol "b" indicates the dielectric film 20. The upper metal layer 30 has a first formation enthalpy H1, and the second interfacial oxide film 25 may have a second formation enthalpy H2. The first formation enthalpy H1 is higher than the second formation enthalpy H2. That is, the formation enthalpy H1 of the upper metal layer 30 is higher than the formation enthalpy H2 of the second interfacial oxide film 25.

In FIG. 2a, although the formation enthalpy of the dielectric film 20 is illustrated as being located between the formation enthalpy H1 of the upper metal layer 30 and the formation enthalpy H2 of the second interfacial oxide film 25, this is intended only for convenience of description and is not limited thereto.

The material having the lower formation enthalpy may be in a more stable state than the material having the higher formation enthalpy. That is, there is a need to supply more energy so as to change the material having the lower formation enthalpy to the material having the higher formation enthalpy. In order for the oxygen diffused from the dielectric film 20 to move to the upper metal layer 30, the oxygen needs to pass through the second interfacial oxide film 25.

However, because the formation enthalpy H2 of the second interfacial oxide film 25 is lowest among the compounds which may be formed by binding the metal oxide forming the second interfacial oxide film 25 with oxygen, when the oxygen contained in the dielectric film 20 is diffused into the second interfacial oxide film 25 and the oxygen concentration of the second interfacial oxide film 25 increases, the formation enthalpy of the second interfacial oxide film 25 increases. However, because the material attempts to maintain a relatively low energy state, even if the oxygen escapes from the dielectric film 20, the escaping oxygen may not pass through the boundary between the second interfacial oxide film 25 and the dielectric film 20. That is, the second interfacial oxide film 25 may prevent or inhibit oxygen contained in the dielectric film 20 from being diffused to the upper metal layer 30.

Explaining from a different point of view, the second interfacial oxide film 25 having a lower formation enthalpy is located between the upper metal layer 30 and the dielectric film 20. That is, the second interfacial oxide film 25 may serve as a potential barrier to prevent or inhibit the oxygen contained in the dielectric film 20 from moving to the upper metal layer 30.

When approaching this from the viewpoint of formation enthalpy, the second interfacial oxide film 25, for example, may be one of titanium oxide ($TiO_x$, $0<x<2$), aluminum oxide ($AlO_x$, $1<x<2$), titanium aluminum oxide ($TiAlO_x$) and manganese oxide ($MnO_x$) ($0<x<2$). Further, the upper metal layer 30, for example, may include one of titanium nitride (TiN), zirconium nitride (ZrN), aluminum nitride (AlN), hafnium nitride (HfN), tantalum nitride (TaN), niobium nitride (NbN), yttrium nitride (YN), lanthanum nitride (LaN), vanadium nitride (VN) and manganese nitride ($Mn_4N$).

Specifically, when TiN and $TiO_x$ are used as each of the upper metal layer 30 and the second interfacial oxide film 25, the formation enthalpy relationship between the upper metal layer 30 and the second interfacial oxide film 25 will be described with reference to FIG. 2b.

The upper metal layer 30 and the second interfacial oxide film 25 contain titanium as the same metal element, the upper metal layer 30 is a metal nitride, and the second interfacial oxide film 25 is a metal oxide.

The formation enthalpy of the titanium nitride contained in the upper metal layer 30 is higher than the formation enthalpy of titanium oxide ($TiO_x$) which may be contained in the second interfacial oxide film 25. In FIG. 2b, because the formation enthalpy of various kinds of titanium oxides is lower than the formation enthalpy of titanium nitride, the second interfacial oxide film 25 containing the titanium oxide is in an energetically stable state than the upper metal layer 30 containing the titanium nitride.

Because the oxygen contained in the dielectric film 20 is diffused and moved to the upper metal layer 30 containing the titanium nitride, oxygen contained in the oxide dielectric film 20 needs to pass through the second interfacial oxide film 25 containing the titanium oxide which is energetically more stable than titanium nitride. However, because the energetically stable titanium oxide serves as a potential barrier against the diffusion of oxygen, the second interfacial oxide film 25 containing the titanium oxide may prevent or inhibit the diffusion of oxygen from the dielectric film 20 to the upper metal layer 30 containing the titanium nitride.

One of the roles of the second interfacial oxide film 25 is an oxygen-donating film which supplies oxygen to the upper metal layer 30 instead of the dielectric film 20 during the manufacturing process. That is, the second interfacial oxide film 25 may be an oxygen sacrificial film which supplies oxygen.

The formation enthalpy of the upper metal layer 30 may be higher than the formation enthalpy of oxide of the upper metal layer 30 formed by oxidizing the upper metal layer 30. Referring to FIG. 2b, when the titanium nitride which may be contained in the upper metal layer 30 reacts with oxygen and changes into titanium oxide, the formation enthalpy decreases. That is, when oxidizing the titanium nitride, titanium oxide is more energetically stable than the titanium nitride that is formed.

That is, when forming the upper metal layer 30 on the dielectric film 20, the upper metal layer 30 attempts to be energetically stabilized by bringing in oxygen contained in the dielectric film 20. However, when the upper metal layer 30 is deprived of oxygen contained in the dielectric film 20, the capacitance of the dielectric film 20 is lowered, and the reliability of the dielectric film also decreases.

Such a phenomenon may be prevented or inhibited through the introduction of the second interfacial oxide film 25 containing the metal oxide. That is to say, the second interfacial oxide film 25 may prevent or inhibit the oxygen contained in the dielectric film 20 from being diffused to the upper metal layer 30, and provides some of the oxygen included in the second interfacial oxide film 25 to the upper metal layer 30. Thus, the second interfacial oxide film 15 improves the electrical characteristics of the structure which includes the dielectric film 20 and the upper metal layer 30.

Specifically, when the upper metal layer 30 is a metal nitride, because the metal atom of the upper metal layer 30 may be energetically stabilized when being bonded with oxygen to form an oxide, the upper metal layer 30 may accept oxygen supplied from the second interfacial oxide film 25. However, the oxygen atom supplied from the second interfacial oxide film 25 to the upper metal layer 30 fails to form a metal element and a metal oxide film by the conditions for forming the upper metal layer 30, and may escape to the upper metal layer 30, but is not limited thereto.

During the manufacturing process, the second interfacial oxide film 25 is formed by a decrease in the number of oxygens bonded per metal element. In other words, during the manufacturing process, the second interfacial oxide film 25 is formed by changing from the second free interfacial film (25a in FIG. 12). That is, the oxygen atom remaining while changing the second free surface layer to the second interfacial oxide film 25 may be supplied to the surrounding film, that is, the upper metal layer 30 or the dielectric film 20. Because the dielectric film 20 is formed to meet stoichiometry, the remaining oxygen atom generated from the second interfacial oxide film 25 may be supplied to the upper metal layer 30.

Also, the free interfacial film may be formed to have the stoichiometric composition before forming the second interfacial oxide film 25. Accordingly, the second interfacial oxide film 25 formed after losing oxygen from the free interfacial film may be a compound having a non-stoichiometric composition. That is, the materials constituting the second interfacial oxide film 25 may be bonded at a composition ratio which does not satisfy the stoichiometry.

In other words, the oxygen concentration contained in the second interfacial oxide film 25 is lower than the oxygen concentration contained in the free interfacial film formed to have a stoichiometric composition. Through FIG. 2b, as a specific example, the free interfacial film may be $TiO_2$ having a stoichiometric composition, but the second interfacial oxide film 25 formed after losing some oxygen from the free interfacial film, may be $TiO_x$ ($0<x<2$), which does not have a stoichiometric composition. When comparing the oxygen concentration between $TiO_2$ and $TiO_x$, the oxygen concentration of $TiO_2$ contained in the free interfacial film may be higher than the oxygen concentration of $TiO_x$ contained in the second interfacial oxide film 25.

The second interfacial oxide film 25 may prevent or inhibit permeation of the nitrogen atom contained in the upper metal layer 30 to the dielectric film 20 from the upper metal layer 30, and will be further described. That is, the second interfacial oxide film 25 may serve as a nitrogen diffusion preventing or inhibiting film.

As described above, the upper metal layer 30 may contain a metal nitride. When the upper metal layer 30 is disposed on the dielectric film 20 without using the second interfacial oxide film 25, the nitrogen atom contained in the upper metal layer 30 is diffused and permeates to the oxide dielectric film 20, and the oxynitride may be formed in the dielectric film 20.

When nitrogen permeates into the dielectric film 20 to form an oxynitride film, the crystallization temperature of the dielectric film 20 may rise. Specifically, the crystallization temperature of the dielectric film containing the nitrogen is higher than the crystallization temperature of the dielectric film 20. Thus, during the manufacturing process, in order to crystallize the deposited dielectric film 20, it is necessary to perform the heat-treatment of the dielectric film 20 at a higher temperature. If the dielectric film 20 into which nitrogen permeates is crystallized at a temperature in which the dielectric film 20 containing no nitrogen can be crystallized, the dielectric film 20 containing nitrogen has a degraded crystallinity.

However, by inserting the second interfacial oxide film 25 capable of preventing or inhibiting permeation of nitrogen between the dielectric film 20 and the upper metal layer 30, the dielectric film 20 may be crystallized even at a relatively low temperature. Thus, the crystallinity of the dielectric film 20 is improved.

The mutual relationship between the upper metal layer 30 and the second interfacial oxide film 25, and the mutual relationship between the second interfacial oxide film 25 and the dielectric film 20 have been described above.

In example embodiments, the first interfacial oxide film 15 and the second interfacial oxide film 25 may have configurations corresponding to each other. That is, the role of the second interfacial oxide film 25 with respect to the upper metal layer 30 may be substantially the same as the role of the first interfacial oxide film 15 with respect to the lower metal layer 10.

Furthermore, the role of the second interfacial oxide film 25 with respect to the dielectric film 20 may be substantially the same as the role of the first interfacial oxide film 15 with respect to the dielectric film 20. Accordingly, the repeated description will be omitted.

However, the present inventive concepts are not limited thereto, and only one of the first and second interfacial oxide films 15, 25 of the present inventive concepts may be present.

Figure 3:
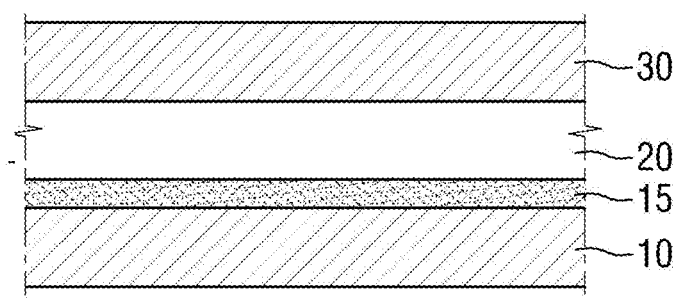
FIG. 3 is a cross-sectional view for illustrating a semiconductor device according to example embodiments of the present inventive concepts.

FIG. 3 is a cross-sectional view for illustrating a semiconductor device according to example embodiments of the present inventive concepts.

The semiconductor device according to the example embodiments of the present inventive concepts will be described with reference to FIG. 3. This example embodiment is substantially the same as the semiconductor device according to example embodiments except that the second interfacial oxide film is not included between the upper metal layer 30 and the dielectric film 20. Therefore, the repeated portions with the above-described embodiment are denoted by the same reference numerals, and the descriptions thereof will not be provided.

Referring to FIG. 3, the semiconductor device 2 includes a lower metal layer 10, a first interfacial oxide film 15, a dielectric film 20 and an upper metal layer 30.

The first interfacial oxide film 15, the dielectric film 20 and the upper metal layer 30 are sequentially formed over the lower metal layer 10.

The first interfacial oxide film 15 may be formed before forming the dielectric film 20 to prevent or inhibit the oxygen contained in the dielectric film 20 from permeating into the lower metal layer 30. Also, as described above, the first interfacial oxide film 15 may perform various roles on the dielectric film 20 and the lower metal layer 10.

FIGS. 4 to 12 are diagrams for explaining a method of manufacturing the semiconductor device according to the example embodiments of the present inventive concepts.

The method of manufacturing the semiconductor device according to the example embodiments of the present inventive concepts illustrated in FIG. 1 will be described with reference to FIGS. 4 to 12.

Although an ALD process, a CVD process, etc. may be utilized as the method of manufacturing the semiconductor device according to the present inventive concepts, the ALD process will be described as an example in example embodiments as illustrated in FIGS. 4 to 12. However, the technical idea of the present inventive concepts is not limited thereto. The ALD process may be performed by an in-situ process. That is to say, the semiconductor device 1 according to example embodiments may be formed in a single chamber 800. However, it is not limited thereto.

In example embodiments, the description will be provided on the assumption that the lower metal layer 10 and the upper metal layer 30 are a titanium nitride film, the first interfacial oxide film 15 and the second interfacial oxide film 25 are a titanium oxide film, and the dielectric film 20 is a zirconium oxide film. This is intended for convenience of description, but the technical idea of the present inventive concepts is not limited thereto. Therefore, the dielectric film 20 may be a laminated structure of the zirconium oxide film and the aluminum oxide film.

Figure 4:
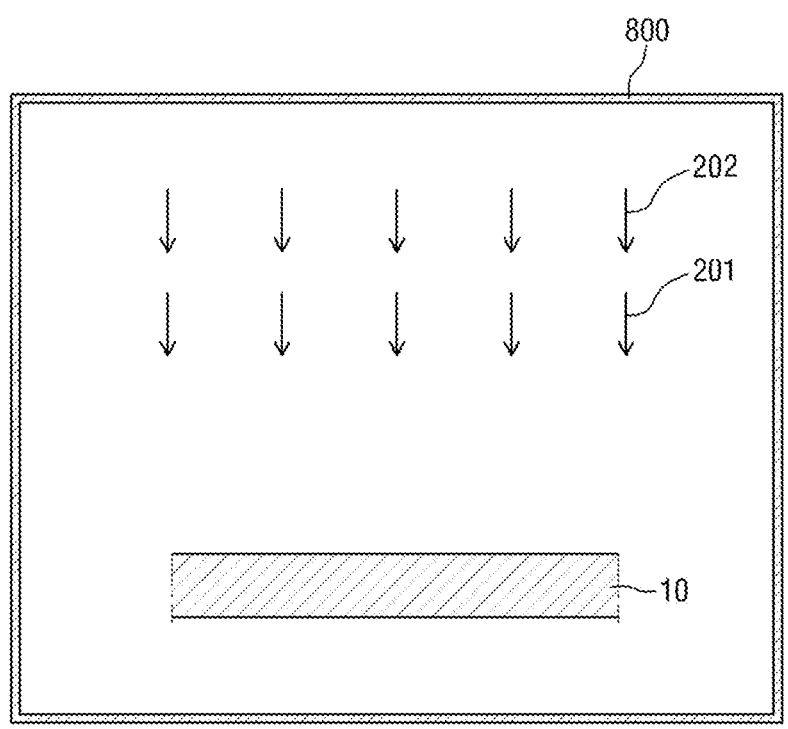
FIGS. 4 to 12 are diagrams for explaining a method of manufacturing the semiconductor device according to example embodiments of the present inventive concepts.

Referring to FIG. 4, the lower metal layer 10 may be formed in the chamber 800. The lower metal layer 10 may be formed by using any one of TDMAT {tetrakis(dimethylamino)titanium; Ti [N (CH$_3$)$_2$)]$_4$}, TDEAT {tetrakis(diethylamino)titanium; Ti [N (C$_2$H$_5$)$_2$]$_4$} or TEMAT {tetrakis (ethylmethylamino)titanium; Ti [N(C$_2$H$_5$)CH$_3$]$_4$} as a titanium precursor material and causing the material to react with the gas while supplying the ammonia (NH$_3$) gas.

Moreover, the method may further include the process of removing impurities, e.g., carbon in the titanium nitride (TiN) contained in the lower metal layer 10, by performing N$_2$ and H$_2$ plasma processing several times while forming the lower metal layer 10 in the above step.

The supply of the ammonia gas into the chamber 800 is cut off, a gas containing the titanium precursor is injected into the chamber 800 (201), and the oxidizing gas is injected (202). The oxidizing gas may be one selected from the group which includes O$_2$, O$_3$ and H$_2$O or a combination thereof.

Figure 5:
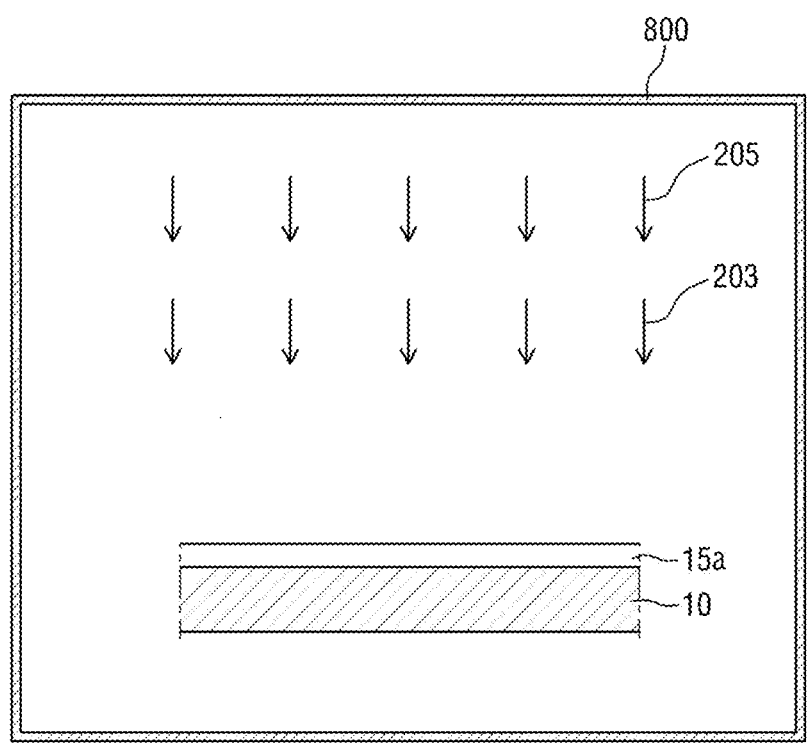

Thus, the first free interfacial oxide film 15a of FIG. 5 is formed on the lower metal layer 10. The first free interfacial oxide film 15a may be a titanium oxide film.

An oxidation process may be performed on the first free interfacial oxide film 15a at a fourth pressure or less, through the reaction with the oxidizing gas. The fourth pressure may be 40 Pa.

Subsequently, referring to FIG. 5, a gas containing the metal precursor material is injected onto the first free interfacial oxide film 15a (203), and a flow gas may be optionally and simultaneously injected (205). This makes it possible to adsorb the metal precursor material onto the first free interfacial oxide film 15a. The flow gas may be an inert gas.

A case of using a zirconium oxide film as the dielectric film 20 will be described as an example, TEMAZ [tetraethyl-methyl amino zirconium; Zr (N (CH$_3$) (C$_2$H$_5$))4] may be supplied as a source gas into the chamber 800. At this time, as a source gas, in addition to the TEMAZ, TDEAZ [tetrakis-diethylamino-zirconium; Zr (N (C$_2$H$_5$)$_2$)$_4$], TEMAZ [tetrakis-methylethylamino-zirconium; Zr (N (CH$_3$) (C$_2$H$_5$))$_4$], etc., may also be used. Further, the metal precursor material may contain one of Hf, Al, Zr, La, Ba, Sr, Ti and Pb.

Meanwhile, in example embodiments, the first free interfacial oxide film 15a may be a titanium oxide (TiO$_y$, 0<y<2), the first free interfacial oxide film 15a changes to the first interfacial oxide film 15 during formation of the dielectric film 20, and the first interfacial oxide film 15 is formed between the lower metal layer 10 and the dielectric film 20. The formation enthalpy of the first interfacial oxide film 15 is lower than the formation enthalpy of the first free interfacial oxide film 15a. Further, the formation enthalpy of the dielectric film 20 is higher than the formation enthalpy of the first interfacial oxide film 15.

Through the steps of FIG. 5, the free dielectric film 20a containing a zirconium precursor material may be formed on the first free interfacial oxide film 15a or the first interfacial oxide film 15. The step of forming the free dielectric film 20a may be performed at a pressure below the first pressure. The first pressure may be 120 Pa.

Figure 6:
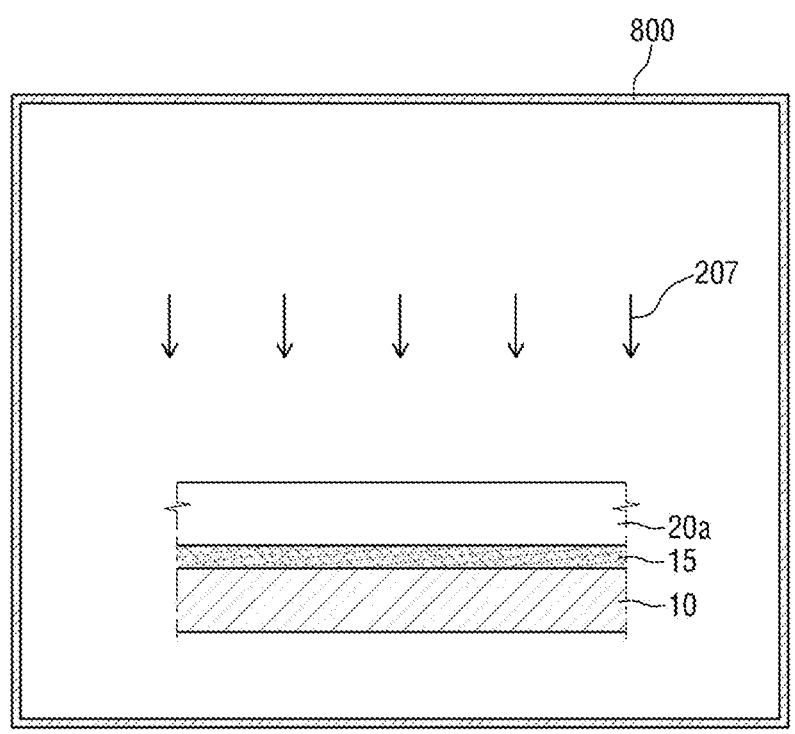

Referring to FIG. 6, the free dielectric film 20a containing the metal precursor material is formed on the first interfacial oxide film 15 (or the first free interfacial oxide film 15a).

A first purge gas may be injected into the free dielectric film 20a (207). The first purge gas may be injected to perform a first purge process of purging the unreacted metal precursor material. The first purge process may be performed at a second pressure or less. The second pressure may be 10 Pa.

In the present inventive concepts, the second pressure may be lower than the first pressure. Further, in the present inventive concepts, the first pressure may be greater than 10 times the second pressure. However, the present inventive concepts are not limited thereto.

The inert gas may be used as the first purge gas, and the inert gas may be Ar, He, Kr, Xe and N$_2$ or the combination thereof.

Figure 7:
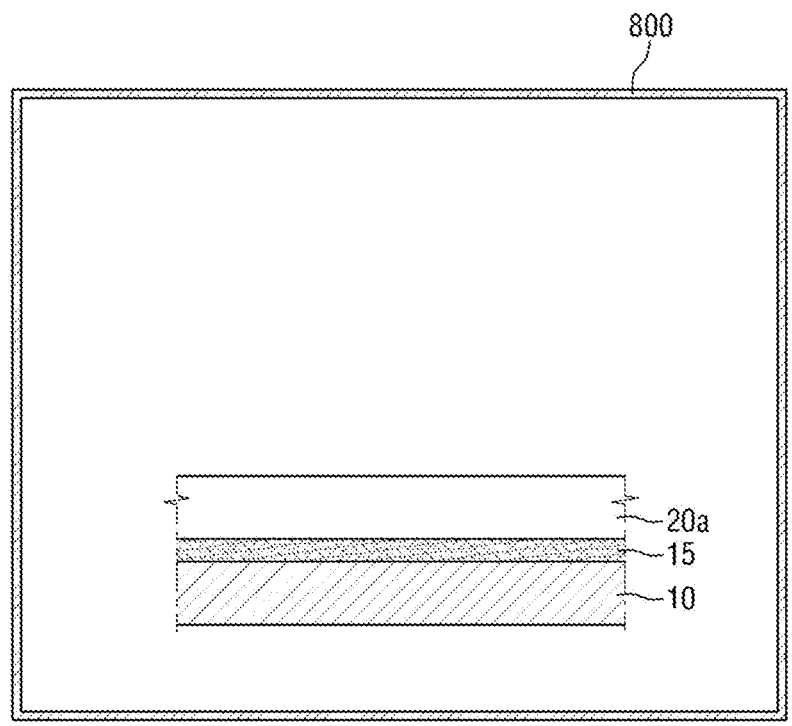

Referring to FIG. 7, a first vacuum process is performed after the first purge process. The first vacuum process is a process of reducing the internal pressure of the chamber 800, and the vacuum process may be performed at a third pressure. The third pressure may be 5 Pa. The third pressure may be smaller than the first and second pressures.

Meanwhile, in example embodiments, the first purge process of FIG. 6 and the first vacuum process of FIG. 7 may be performed at a pressure below 10 Pa. In this case, the free dielectric film 20a may be more uniformly formed.

Through the steps of FIGS. 5, 6 and 7, the free dielectric film 20a may be uniformly and stably formed on the first interfacial oxide film 15. In example embodiments, the steps of FIGS. 5, 6 and 7 may be referred to as a first process of adsorbing the metal precursor material. In example embodiments, the first process may be sequentially performed by being repeated two times or more, but is not limited thereto.

Figure 8:
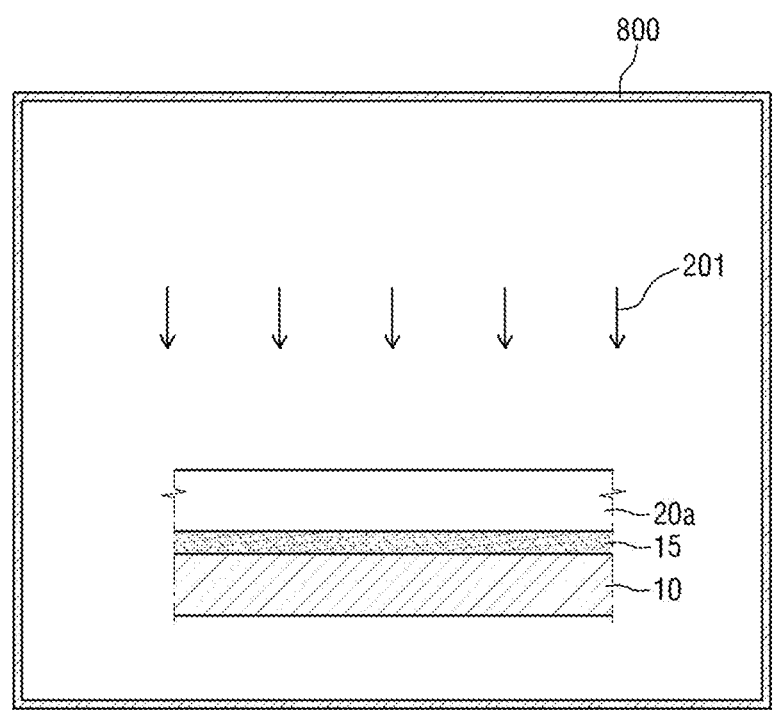

Referring to FIG. 8, the oxidizing gas is injected onto the free dielectric film 20a (201). The oxidizing gas is an oxidation reaction gas, and may be one selected from the group which includes O$_2$, O$_3$ and H$_2$O or a combination thereof. The dielectric film 20 is formed on the first interfacial oxide film 15 through the oxidizing gas injection (201). The process of forming the dielectric film 20 may be performed at a pressure below the first pressure. The first pressure may be 120 Pa.

Figure 9:
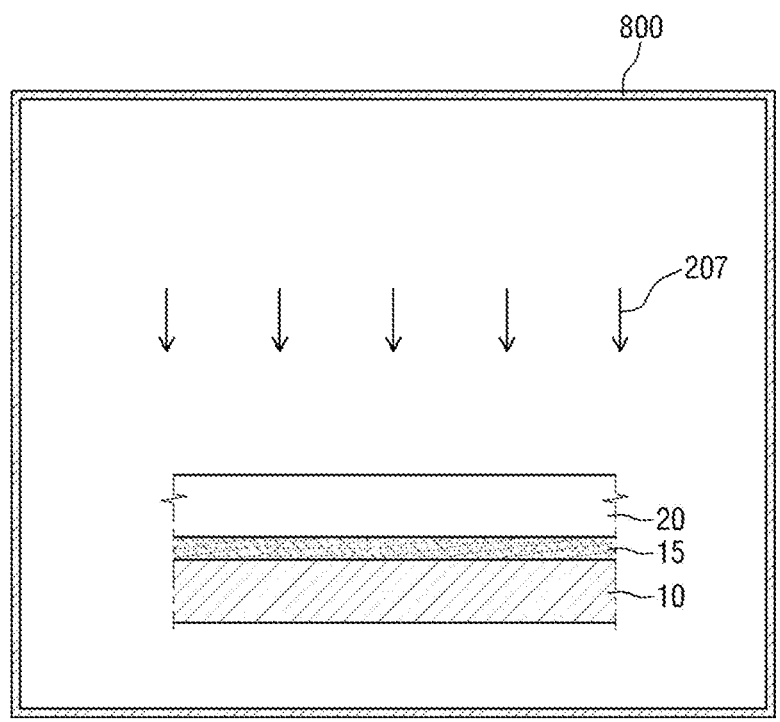

Referring to FIG. 9, a second purge gas may be injected onto the dielectric film 20 (207). The second purge gas may be injected to perform a second purge process which removes the unreacted materials. The second purge process may be performed at a second pressure or less. The second pressure may be 10 Pa. Therefore, as described above, the first pressure and the second pressure may differ from each other by 10 times or more. That is, the first pressure may be greater than 10 times the second pressure.

Figure 10:
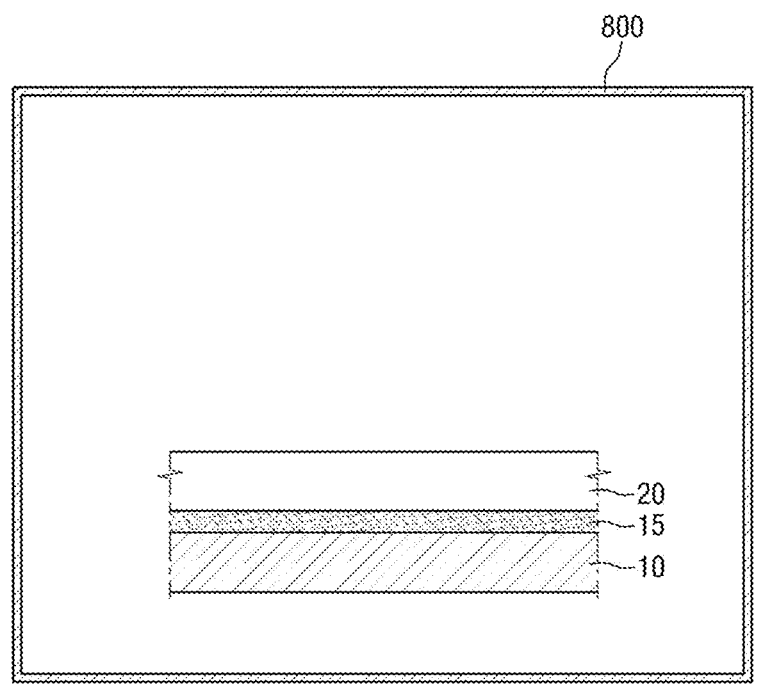

Referring to FIG. 10, a second vacuum process is performed after the second purge process. The second vacuum process is a process of reducing the internal pressure of the chamber 800, and the second vacuum process may be performed at a third pressure or less. The third pressure may be 5 Pa.

In example embodiments, the steps of FIGS. 8, 9 and 10 may be referred to as a second process of forming a dielectric film by causing the metal precursor material to react. In example embodiments, the second process may be performed repeatedly twice or more, but is not limited thereto.

Meanwhile, in example embodiments, an additional purge process and an additional vacuum process may be performed between the first process and the second process at each of a pressure of 5 Pa or less and a pressure of 10 Pa or less. However, example embodiments are not limited thereto, and the additional purge process and the additional vacuum processes may be omitted.

Figure 11:
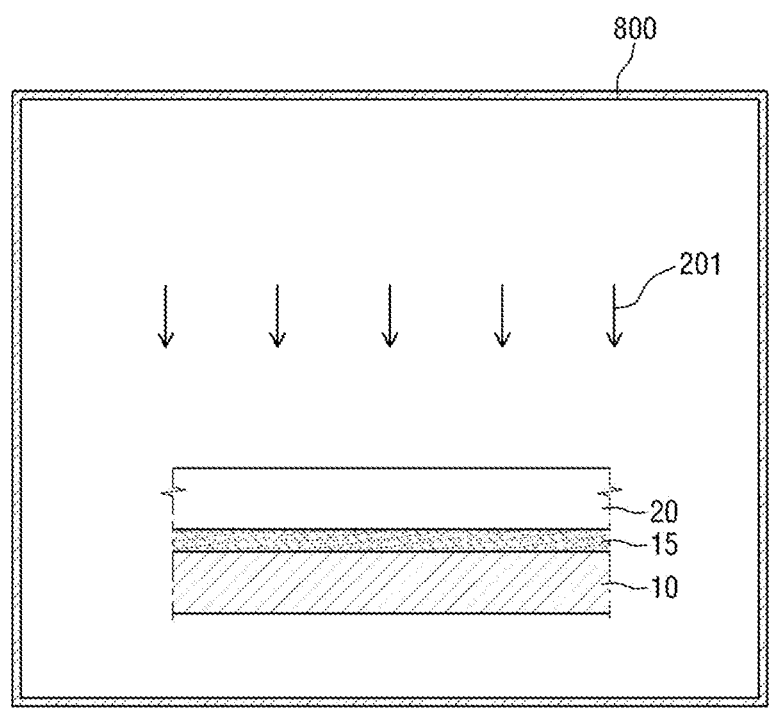
Figure 12:
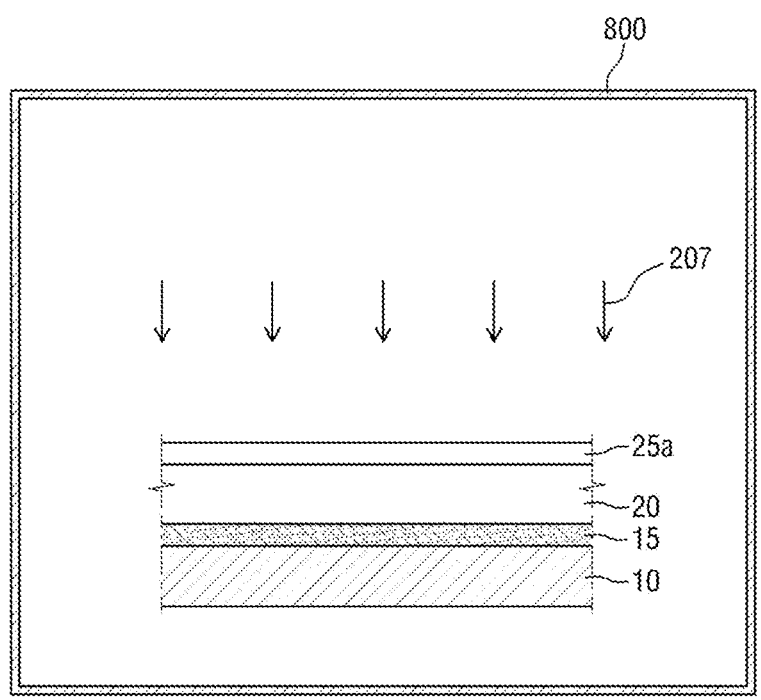

Referring to FIG. 11, a gas containing the titanium precursor and the oxidizing gas are injected onto the dielectric film 20 (201) to form a second free interfacial oxide film 25a of FIG. 12. Referring to FIG. 12, a gas containing a titanium precursor material and an ammonia gas are injected (207) onto the second free interfacial oxide film 25a, thereby forming the upper metal layer 30 of FIG. 1.

While the upper metal layer 30 is formed, the second free interfacial oxide film 25a is changed to the second interfacial oxide film 25, and the second interfacial oxide film 25 is formed between the upper metal layer 30 and the dielectric film 20.

The formation enthalpy H2 of the second interfacial oxide film 25 is lower than the formation enthalpy H3 of the second free interfacial oxide film 25a. That is, while the upper metal layer 30 is formed, the second free interfacial oxide film 25a is changed to the second interfacial oxide film 25 having the lower formation enthalpy than the second free interfacial oxide film 25a.

Further, the formation enthalpy H2 of the second interfacial oxide film 25 formed by the change of the second free interfacial oxide film 25a is lower than the formation enthalpy H1 of the upper metal layer 30. That is, the formation enthalpy H1 of the upper metal layer 30 is higher than the formation enthalpy H2 of the second interfacial oxide film 25.

While the upper metal layer 30 is formed, the second free interfacial oxide film 25a provides some of the oxygen atoms contained in the second free interfacial oxide film 25a to the upper metal layer 30. At the same time, the second free interfacial oxide film 25a may prevent or inhibit the oxygen atoms contained in the dielectric film 20 from being diffused to the upper metal layer 30. Further, the second free interfacial oxide film 25a may prevent or inhibit the nitrogen atoms provided during formation of the upper metal layer 30 from permeating into the dielectric film 20.

Because some of the oxygen contained in the second free interfacial oxide film 25a is provided to the upper metal layer 30, the number of oxygens bonded per metal atom in the second free interfacial oxide film 25a is larger than the number of oxygens bonded per metal atom in the second interfacial oxide film 25. That is, the change of the free interfacial film 25a to the second interfacial oxide film 25 is a reduction reaction, and the oxidation enthalpy of the reaction of the second free interfacial oxide film 25a to the second interfacial oxide film 25 has a positive value.

Because the oxygen atom is provided to the upper metal layer 30 from the second free interfacial oxide film 25a to form the second interfacial oxide film 25, an oxygen vacancy is included in the second interfacial oxide film 25. The oxygen vacancy included in the second interfacial oxide film 25 is a type of defect and may serve as a path through which current can flow. Therefore, the second interfacial oxide film 25 is made of a metal oxide, but the second interfacial oxide film 25 may be a conductive film through which electricity flows.

In the method of manufacturing the semiconductor device according to the example embodiments of the present inventive concepts, the second free interfacial oxide film 25a may be formed of a compound in which stoichiometry is effected, but is not limited thereto. That is, the second free interfacial oxide film 25a may be an oxygen-rich metal oxide obtained by excessively containing oxygen in a metal oxide in which the stoichiometry is affected.

A layout of a semiconductor device according to example embodiments of the present inventive concepts will be described referring to FIG. 13.

Figure 13:
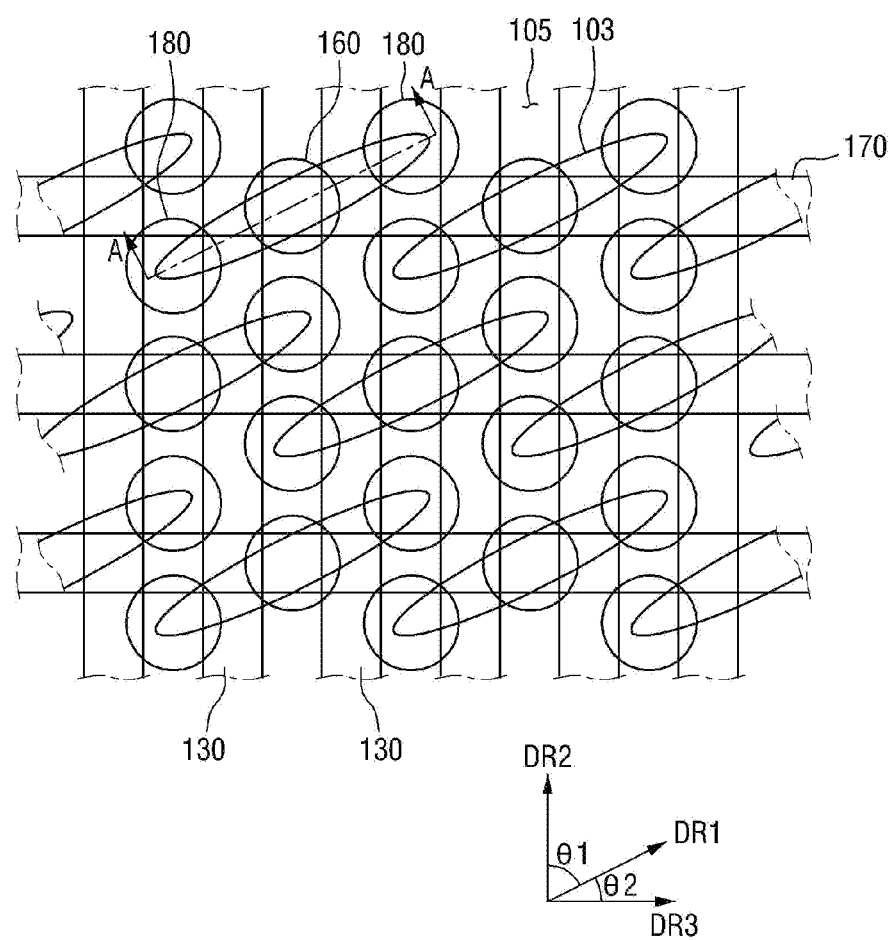
FIG. 13 is a layout diagram of the semiconductor device according to example embodiments of the present inventive concepts.

FIG. 13 is a layout diagram of the semiconductor device according to the example embodiments of the present inventive concepts. That is, FIG. 13 illustrates the layout before an information storage unit is formed.

Figure 14:
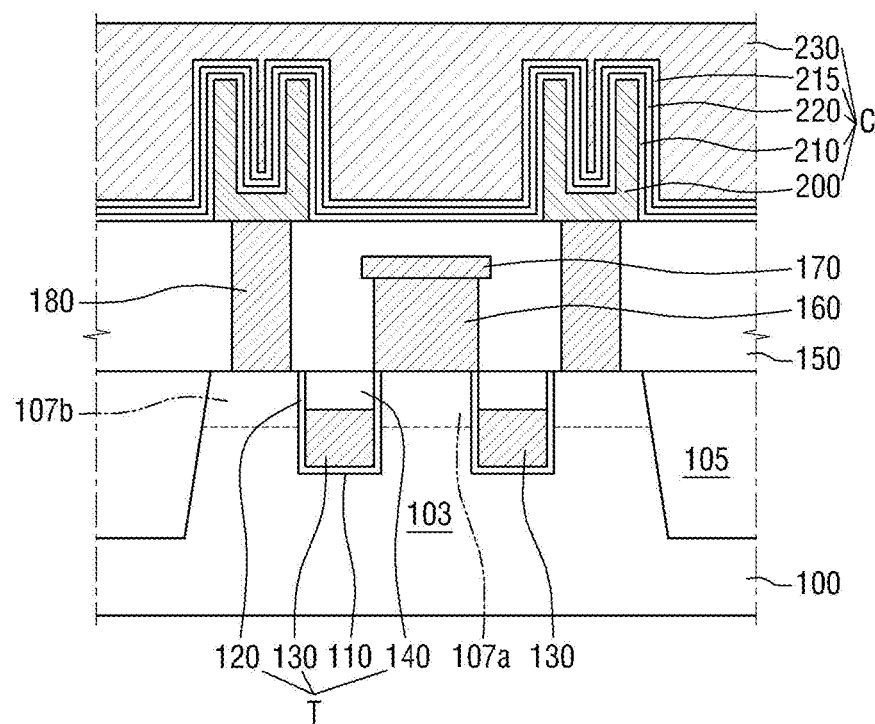
FIG. 14 is a cross-sectional view for explaining the semiconductor device according to example embodiments of the present inventive concepts.

Referring to FIGS. 13 and 14, in the semiconductor device according to the example embodiments of the present inventive concepts, a unit active area 103 is defined by forming a device isolation area 105 in the substrate 100.

Specifically, the unit active area 103 is formed to extend in a first direction DR1, the gate electrode (i.e., a word line) 130 is formed to extend in a second direction DR2 which forms an acute angle with the first direction DR1, and a bit line 170 is formed to extend in a third direction DR3 which forms at an acute angle with the first direction DR1.

Here, an angle when "a specific direction and another specific direction form a predetermined or given angle" means a smaller angle of two angles generated by intersection of the two directions. For example, when the angle capable of being generated by the intersection of two directions is 120° and 60°, the angle means 60°. Therefore, as illustrated in FIG. 13, an angle formed between the first direction DR1 and the second direction DR2 is θ1, and an angle formed between the first direction DR1 and the third direction DR3 is θ2.

In this way, the reason for forming θ1 and/or θ2 as an acute angle is to ensure a maximum interval between a bit line contact 160 for connecting the unit active area 103 with the bit line 170 and a storage node contact 180 (a second contact plug of FIG. 14) for connecting the unit active area 103 with the capacitor. θ1 and θ2 may be, for example, each of 45° and 45° or 30° and 60° or 60° and 30°, but it is not limited thereto.

The semiconductor device according to example embodiments of the present inventive concepts will be described referring to FIG. 14.

FIG. 14 is a cross-sectional view for explaining the semiconductor device according to example embodiments of the present inventive concepts. FIG. 14 is a cross-sectional view taken along a line A-A in FIG. 13 for explaining the semiconductor device including a capacitor.

Referring to FIG. 14, the semiconductor device 3 may include a substrate 100, a transistor T, a bit line 170 and a capacitor C.

The unit active area 103 and the device isolation area 105 are formed on the substrate 100. The substrate 100 may be a bulk silicon or a silicon-on-insulator (SOI). Alternatively, the substrate 100 may be a silicon substrate or may contain, but not limited to, other materials, for example, silicon germanium, indium antimonide, lead telluride, indium arsenide, indium phosphide, gallium arsenide or gallium antimonide. Hereinafter, a silicon substrate is adopted as an example. The device isolation area 105 may be formed through a shallow trench isolation (STI) process. In FIG. 13, the unit active area 103 extending in the first direction DR1 may be limited by the device isolation area 105.

Two transistors T may be formed in a single unit active area 103. The two transistors T include two gate electrodes 130 formed across the unit active area 103, a first impurity area 107a formed in the unit active area 103 between the two gate electrodes 130, and a second impurity area 107b formed between the gate electrode 130 and the device isolation area 105. That is, the two transistors T share the first impurity area 107a and do not share the second impurity area 107b.

Each of the transistors T may include a gate insulation film 120, a gate electrode 130 and a capping pattern 140.

The gate insulation film 120 may be formed along side surfaces and a bottom surface of a trench 110 formed in the substrate 100. The gate insulation film 120, for example, may include a silicon oxide or a dielectric having a higher dielectric constant than the silicon oxide. In FIG. 14, the gate insulation film 120 is illustrated as being generally formed on the side surfaces of the trench 110, but is not limited thereto. That is, the gate insulation film 120 is formed in contact with the lower part of the side surface of the trench 110, and a capping pattern 140 to be described later may be formed in contact with the upper part of the side surface of the trench 110.

The gate electrode 130 may be formed to fill a part of the trench 110, rather than fully filling the trench 110. That is, the gate electrode 130 may have a recessed form. The gate electrode 130, for example, may be formed using doped polysilicon, titanium nitride (TiN), tantalum nitride (TaN), tungsten nitride (WN), titanium (Ti), tantalum (Ta), tungsten (W) or the like, but it is not limited thereto. The capping pattern 140 may be formed on the gate electrode 130 to fill the trench 110. The capping pattern 140 may contain an insulating material, and for example, may contain at least one of silicon oxide, silicon nitride and silicon oxynitride. In FIG. 14, the capping pattern 140 is illustrated as filling the space between the gate electrode 130 and the gate insulation film 120 formed on the sidewall of trench 110, but is not limited thereto. That is, the capping pattern 140 may be formed in contact with the substrate 100, that is, the first impurity area 107*a* and the second impurity area 107*b*.

In the semiconductor device according to example embodiments of the present inventive concepts, the transistor T is described as a transistor having a buried channel (buried channel array transistor: BCAT), but is not limited thereto. That is, the transistor T may have various structures, such as a transistor of a planar structure or a transistor (a vertical channel array transistor: VCAT) structure having a vertical channel formed in a pillar-shaped unit active area 103.

An interlayer insulation film 150 may be formed on the substrate 100. The interlayer insulation film 150, for example, may contain at least one of silicon oxide, silicon nitride and silicon oxynitride. The interlayer insulation film 150 may be a single layer or multi-layers.

A first contact plug (a bit line contact 160) electrically connected to the first impurity area 107*a* may be formed in the interlayer insulation film 150. The first contact plug 160 may contain a conductive material, and for example, may contain at least one of polycrystalline silicon, metal silicide compound, conductive metal nitride and metal, but are not limited thereto. A bit line 170 electrically connected to the first impurity area 107*a* via the first contact plug 160 may be formed on the first contact plug 160. The bit line 170 may contain a conductive material, and for example, may contain at least one of polycrystalline silicon, metal silicide compound, conductive metal nitride and metal, but are not limited thereto.

A second contact plug 180 may be formed in the interlayer insulation film 150 to pass through the interlayer insulation film 150. The second contact plug 180 may be electrically connected to the second impurity area 107*b*. The second contact plug 180 may include a storage node contact. The second contact plug 180 may contain a conductive material, and for example, may contain at least one of polycrystalline silicon, metal silicide compound, conductive metal nitride, and metal, but are not limited thereto.

A capacitor C electrically connected to the second impurity area 107*b* may be formed on the interlayer insulation film 150. The capacitors C may be electrically connected to the second impurity area 107*b* via the second contact plug 180.

The capacitor C includes a lower electrode 200, a first interfacial film 210, a second interface film 215, a capacitor dielectric film 220 and an upper electrode 230. Referring to FIG. 1, the lower electrode 200 may be the lower metal layer 10, the first interfacial film 210 may be the first interfacial oxide film 15, the capacitor dielectric film 220 may be the dielectric film 20, the second interface film 215 may be the second interfacial oxide film 25, and the upper electrode 230 may be the upper metal layer 30. Thus, the capacitor C may be formed by the method of manufacturing the semiconductor device which has been described through FIGS. 4 and 12.

Therefore, the capacitor dielectric film 220 may include a first process which sequentially includes the process of adsorbing the metal precursor material, the first purge process and the second vacuum process, and a second process which sequentially includes the process of oxidizing the adsorbed metal precursor material, the second purge process and the second vacuum process.

As described above, the first purge process and the second purge process may be performed at a second pressure or less. The second pressure may be 10 Pa. The first vacuum process and the second vacuum process may be performed at a third pressure or less. The third pressure may be 5 Pa.

In the semiconductor device according to example embodiments of the present inventive concepts, the lower electrode 200 may have a cylindrical shape including an inner wall and an outer wall. The lower electrode 200 may have a cylindrical shape having an aspect ratio of 30 or more. When the aspect ratio of the lower electrode 200 is large, the uniform interfacial film and the dielectric film are hardly formed on the inner wall. However, in example embodiments of the present inventive concepts, the first purge process and the second purge process may be performed at a pressure of 10 Pa or less, and the first vacuum process and the second vacuum process may be performed at a pressure of 5 Pa or less. Thus, even when the lower electrode 200 has a cylinder shape, it is possible to form a uniformly oxidized interface film and a dielectric film having a uniform thickness.

The lower electrode 200 is formed to protrude on the substrate 100 and is electrically connected to the second contact plug 180. The lower electrode 200 formed to protrude on the substrate 100 may extend long in a direction, that is, in the thickness direction of the substrate 100.

In the semiconductor device according to the example embodiments of the present inventive concepts, although the lower electrode 200 may have a cylindrical shape including an inner wall and an outer wall, the cylindrical shape illustrated in FIG. 14 is only intended for convenience of explanation, but it is not limited thereto. Thus, it is a matter of course that the lower electrode 200 may have cylindrical shapes of various shapes.

The first interfacial film 210 is formed on the lower electrode 200. The first interfacial film 210 may be formed along the inner and outer walls of the cylindrical lower electrode 200.

The capacitor dielectric film 220 is formed on the first interfacial film 210. The second interfacial film 215 is formed on the capacitor dielectric film 220. As described in FIGS. 1 to 3, the first and the second interface films 210 and 215 may be the first interfacial oxide film 15 and the second interfacial oxide film 25 formed of a metal oxide, and may have the second formation enthalpy H2.

The upper electrode 230 is formed on the second interface film 215 in contact with the second interface film 215.

In FIG. 14, the upper electrode 230 is illustrated as being formed on the interlayer insulation film 150 in a plate-like form, but is not limited thereto. It is a matter of course that the upper electrode 230 may be formed along the inner and outer walls of the cylindrical lower electrode 200.

A semiconductor device according to example embodiments of the present inventive concepts will be described referring to FIG. 15. This embodiment is substantially the same as the semiconductor device according to the example embodiments as illustrated in FIG. 14 except that this embodiment does not include the second interface film 215. Accordingly, the repeated description will not be provided.

Figure 15:
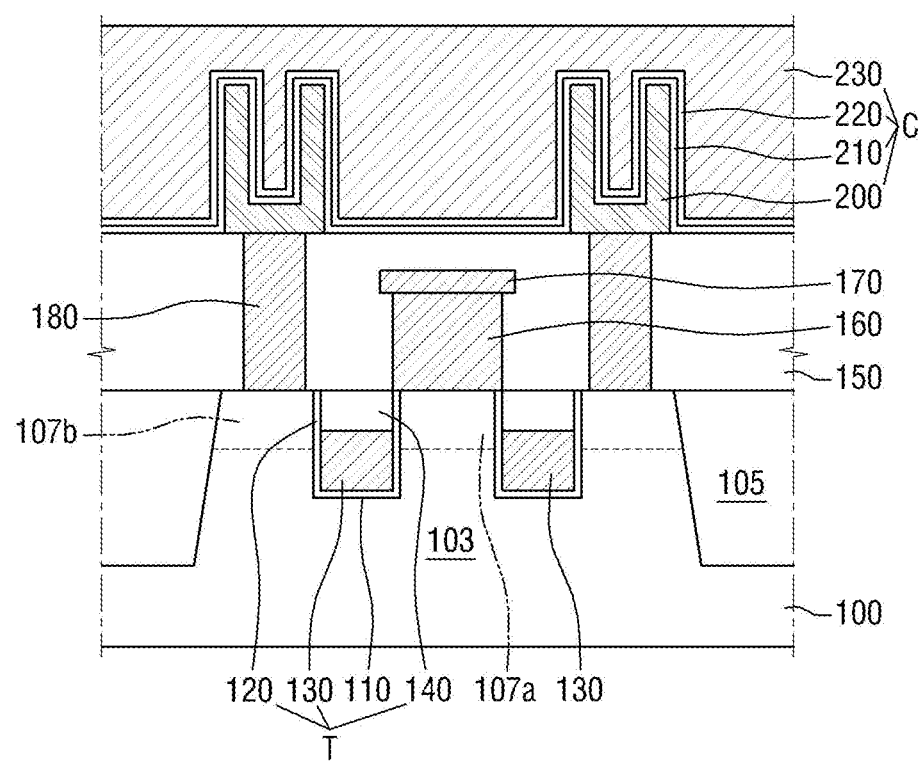
FIG. 15 is a cross-sectional view for explaining the semiconductor device according to example embodiments of the present inventive concepts.

FIG. 15 is a cross-sectional view for explaining the semiconductor device according to the example embodiments of the present inventive concepts. FIG. 15 is a cross-sectional view taken along the line A-A of FIG. 13 for explaining the semiconductor device including the capacitor.

Figure 16:
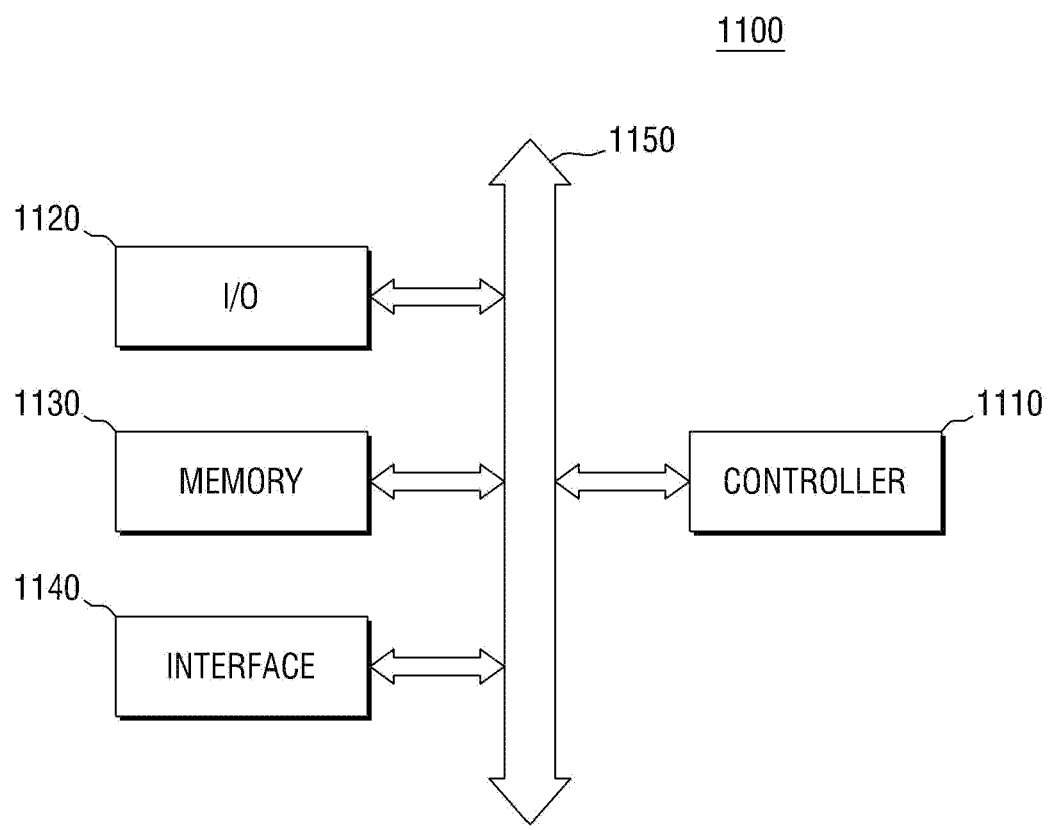
FIG. 16 is a block diagram illustrating an example of an electronic system including the semiconductor device according to the example embodiments of the present inventive concepts.

FIG. 16 is a block diagram illustrating an example of an electronic system including the semiconductor device according to example embodiments of the present inventive concepts.

Referring to FIG. 16, an electronic system 1100 according to example embodiments of the present inventive concepts may include a controller 1110, an input/output (I/O) device 1120, a memory device 1130, an interface 1140 and a bus 1150. The controller 1110, the I/O device 1120, the memory device 1130 and/or the interface 1140 may be connected to one another through the bus 1150. The bus 1150 corresponds to a path through which the data are moved.

The controller 1110 may include at least one of a microprocessor, a digital signal processor, a microcontroller and logic devices capable of performing similar functions to the elements. The I/O device 1120 may include a keypad, a keyboard and a display device. The memory device 1130 may store data and/or commands. The memory device 1130 may include the semiconductor device according to example embodiments of the present inventive concepts. The memory device 1130 may include a DRAM. The interface 1140 may serve to transmit data to or receive data from a communication network. The interface 1140 may be a wired or wireless interface. For example, the interface 1140 may include an antenna or a wired or wireless transceiver.

The electronic system 1100 may be applied to all types of electronic products capable of transmitting or receiving information in a wireless environment, such as a personal digital assistant (PDA), a portable computer, a web tablet, a wireless phone, a mobile phone, a digital music player and a memory card.

Figure 17:
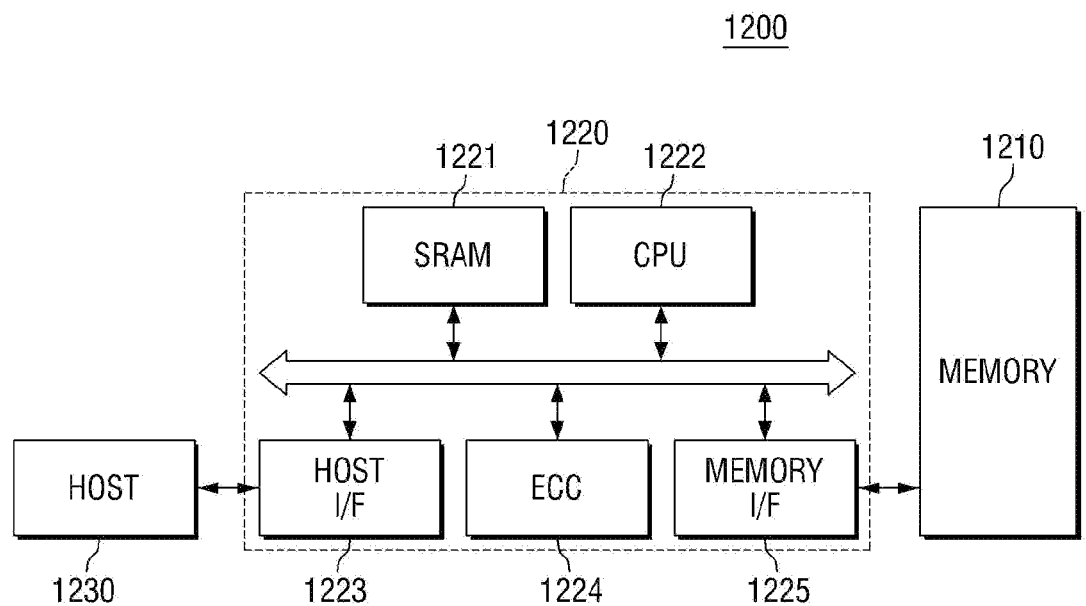
FIG. 17 is a block diagram illustrating an example of the memory card including the semiconductor device according to the example embodiments of the present inventive concepts.

FIG. 17 is a block diagram illustrating an example of the memory card including the semiconductor device according to the example embodiments of the present inventive concepts.

Referring to FIG. 17, the memory 1210 including the semiconductor device according to example embodiments of the present inventive concepts may be adopted in a memory card 1200. The memory card 1200 may include a memory controller 1220 which controls the data exchange between a host 1230 and the memory 1210. The SRAM 1221 may be used as the operation memory of a central processing unit 1222. The host interface 1223 may include a protocol through which a host 1230 is connected to the memory card 1200 to exchange data. An error correction code 1224 may detect and correct the error of the data read from the memory 1210. The memory interface 1225 may be interfaced with the memory 1210. The central processing unit 1222 may perform the overall control operations about the data exchange of the memory controller 1220.

Figure 18:
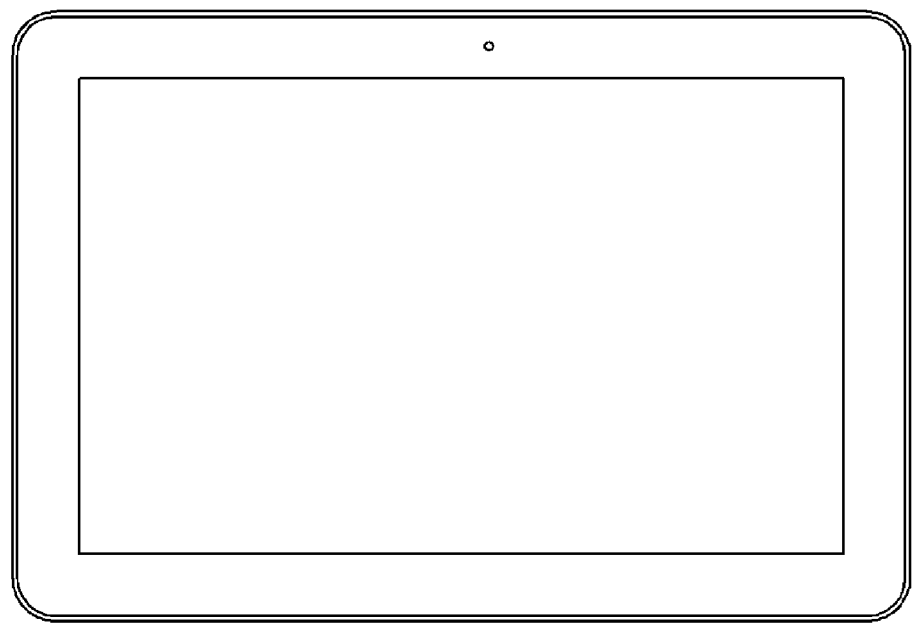
FIGS. 18 to 20 are diagrams illustrating examples of the semiconductor systems to which the semiconductor device according to example embodiments of the present inventive concepts can be applied.
Figure 19:
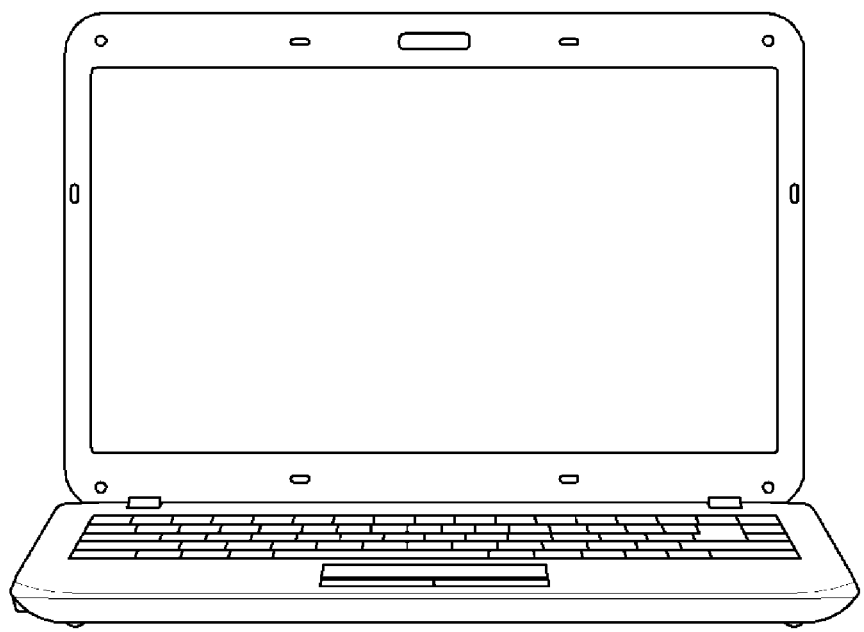
Figure 20:
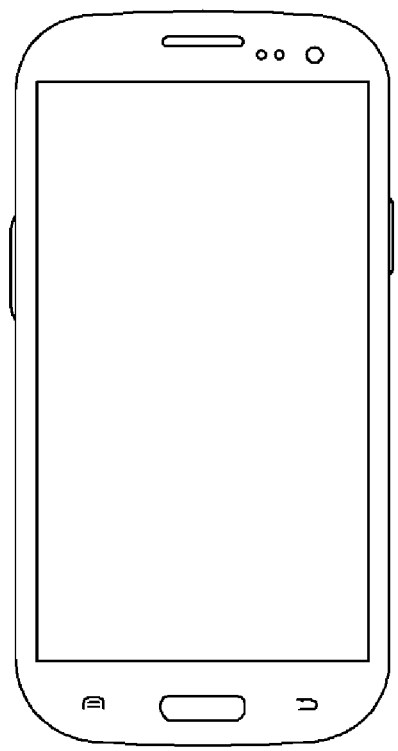

FIGS. 18 to 20 are diagrams illustrating examples of the semiconductor systems to which the semiconductor device according to example embodiments of the present inventive concepts can be applied.

FIG. 18 illustrates a tablet personal computer (PC) 1200, FIG. 19 illustrates a notebook computer 1300, and FIG. 20 illustrates a smartphone 1400. At least one of the semiconductor devices according to example embodiments of the present inventive concepts may be used in the tablet PC 1200, the notebook computer 1300, and the smartphone 1400.

Further, it is obvious to a person skilled in the art that the semiconductor devices according to example embodiments of the present inventive concepts may also be applied to other IC devices other than those set forth herein. That is, while only the tablet PC 120, the notebook computer 1300 and the smartphone 1400 have been described above as examples of a semiconductor system according to example embodiments of the present inventive concepts, the examples of the semiconductor system according to example embodiments are not limited thereto.

In example embodiments of the present inventive concepts, the semiconductor system may be provided as a computer, an Ultra Mobile PC (UMPC), a work station, a net-book computer, a personal digital assistant (PDA), a portable computer, a wireless phone, a mobile phone, an e-book, a portable multimedia player (PMP), a portable game console, a navigation device, a black box, a digital camera, a 3-dimensional television set, a digital audio recorder, a digital audio player, a digital picture recorder, a digital picture player, a digital video recorder, a digital video player, etc.

While example embodiments of the present inventive concepts have been described with reference to accompanying drawings, it will be understood by those of ordinary skill in the art that the present inventive concepts can be produced in various different forms without being limited to the above embodiments, and the present inventive concepts may be embodied in other specific forms without changing the technical spirit or essential characteristics of the present inventive concepts. Example embodiments should be considered in a descriptive sense only rather than an imitative sense in all aspects. Therefore, the scope of the inventive concepts is defined not by the detailed description of the inventive concepts but by the technical spirits set forth in the appended claims.

What is claimed is:

1. A method of manufacturing a semiconductor device, the method comprising:
    forming a lower metal layer;
    forming an interfacial oxide film on the lower metal layer;
    providing a metal precursor on the interfacial oxide film at a first pressure to adsorb a first portion of the metal precursor into the interfacial oxide film;
    performing a first purge process at a second pressure to remove a second portion of a remaining unadsorbed metal precursor, the second pressure lower than the first pressure;
    preforming a first vacuum process at a third pressure lower than the second pressure;
    providing a first portion of an oxidizing gas at the first pressure to react with the first portion of the metal precursor;
    performing a second purge process at the second pressure to remove a second portion of a remaining unreacted oxidizing gas and form a dielectric film; and
    forming an upper metal layer on the dielectric film.

2. The method of claim 1, wherein the providing a metal precursor, the performing a first purge process and the performing a first vacuum process are performed sequentially and repeatedly.

3. The method of claim 1, further comprising:
    performing a second vacuum process at the third pressure after the forming a dielectric film.

4. The method of claim 3, wherein the providing an oxidizing gas, the performing a second purge process and the performing a second vacuum process are performed sequentially and repeatedly.

5. The method of claim 1, wherein the second pressure is 10 Pa or less.

6. The method of claim 1, wherein the forming a lower metal layer forms the lower metal layer to have a cylindrical shape.

7. The method of claim 1, wherein the forming a interfacial oxide film forms the interfacial oxide film at a fourth pressure lower than the first pressure and higher than the second pressure.

8. The method of claim 1, wherein the first pressure is at least 10 times more than the second pressure.

9. A method of manufacturing a semiconductor device, the method comprising:
   forming a lower electrode having a cylindrical shape, the lower electrode including a titanium nitride film;
   forming an interfacial film on the lower electrode, the interfacial film including a titanium oxide film;
   providing a zirconium precursor on the interfacial film to adsorb the zirconium precursor into the interfacial film;
   performing a first purge process to remove a remaining portion of an unadsorbed zirconium precursor at a pressure of 10 Pa or less;
   preforming a first vacuum process at a pressure of 5 Pa or less;
   providing an oxidizing gas to react with the zirconium precursor adsorbed into the interfacial film to form a dielectric film; and
   forming an upper electrode on the dielectric film.

10. The method of claim 9, wherein the providing a zirconium precursor, the performing a first purge process and the performing a first vacuum process are performed sequentially and repeatedly.

11. The method of claim 9, further comprising:
   performing a second purge process to remove a portion of the oxidizing gas that does not react with the zirconium precursor at the pressure of 10 Pa or less after the providing an oxidizing gas.

12. The method of claim 11, further comprising:
   performing a second vacuum process at the pressure of 5 Pa or less after the performing a second purge process.

13. The method of claim 12, wherein the providing an oxidizing gas, the performing a second purge process and the performing a second vacuum process are performed sequentially and repeatedly.

14. A method comprising:
   forming an interfacial oxide film on a cylindrical lower electrode;
   providing a metal precursor on the interfacial oxide film to adsorb a first portion of the metal precursor into the interfacial oxide film;
   performing a first purge process to remove a second portion of the metal precursor that remains unadsorbed by the interfacial oxide film at a first pressure of 10 Pa or less;
   performing a first vacuum process at a second pressure less than the first pressure;
   providing a first portion of an oxidizing gas to react with the first portion of the metal precursor to form a dielectric film;
   performing a second purge process to remove a second portion of the oxidizing gas that does not react with the metal precursor at the first pressure; and
   performing a second vacuum process at the second pressure.

15. The method of claim 14, wherein the second pressure is 5 Pa or less.

16. The method of claim 14, wherein the providing a metal precursor, the performing a first purge process and the performing a first vacuum process are performed sequentially and repeatedly.

17. The method of claim 14, wherein the providing an oxidizing gas, the performing a second purge process and the performing a second vacuum process are performed sequentially and repeatedly.

18. The method of claim 14, further comprising:
   forming an upper electrode on the dialect film.

* * * * *